(12) United States Patent
Peng et al.

(10) Patent No.: US 10,454,066 B2
(45) Date of Patent: Oct. 22, 2019

(54) THIN-FILM PACKAGE STRUCTURE AND OLED COMPONENT

(71) Applicant: Shenzhen China Star Optoelectronics Technology Co., Ltd., Shenzhen, Guangdong (CN)

(72) Inventors: Qiming Peng, Guangdong (CN); Weijing Zeng, Guangdong (CN); Wenjie Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/324,184

(22) PCT Filed: Nov. 15, 2016

(86) PCT No.: PCT/CN2016/105889
§ 371 (c)(1),
(2) Date: Jan. 5, 2017

(87) PCT Pub. No.: WO2018/040294
PCT Pub. Date: Mar. 8, 2018

(65) Prior Publication Data
US 2018/0183005 A1    Jun. 28, 2018

(30) Foreign Application Priority Data
Aug. 31, 2016   (CN) .......................... 2016 1 0797608

(51) Int. Cl.
*H01L 51/52*   (2006.01)
*H01L 51/00*   (2006.01)
(Continued)

(52) U.S. Cl.
CPC ...... *H01L 51/5256* (2013.01); *H01L 51/0061* (2013.01); *H01L 51/5044* (2013.01);
(Continued)

(58) Field of Classification Search
CPC ............. H01L 51/5256; H01L 51/0055; H01L 51/0058; H01L 51/0061; H01L 51/5044;
(Continued)

(56) References Cited

U.S. PATENT DOCUMENTS

2006/0061272 A1* 3/2006 McCormick ........ H01L 51/5253
313/512
2006/0246811 A1* 11/2006 Winters .............. H01L 51/5253
445/25
(Continued)

FOREIGN PATENT DOCUMENTS

| CN | 101577306 | 11/2009 |
|---|---|---|
| CN | 101661995 | 3/2010 |

(Continued)

OTHER PUBLICATIONS

International Search Report and Written Opinion for International Application No. PCT/CN2016/105889, dated May 15, 2017.
(Continued)

*Primary Examiner* — Dzung Tran
(74) *Attorney, Agent, or Firm* — Andrew C. Cheng

(57) ABSTRACT

A thin-film package structure and an OLED component are disclosed. The present disclosure aims to solve the technical problem of a low light-emitting efficiency of an OLED display device and a poor package effect in the prior art. The thin-film package structure includes at least two organic material film layers, and at least two inorganic material film layers. An organic material film layer and an inorganic material film layer are arranged in an alternate manner. The inorganic material film layer includes a magnetic material film layer and a non-magnetic material film layer. The OLED component packaged by the thin-film package structure includes a substrate, and an OLED component that is formed on the substrate. A magnetic field generated by the magnetic material in the thin-film layers can act on the
(Continued)

OLED, and thus a light-emitting efficiency of the OLED display device can be improved. Moreover, aqueous vapor and oxygen at outside environment can be prevented from permeating into the OLED display device by the thin-film package structure, and a package performance of the OLED display device can be satisfied.

8 Claims, 2 Drawing Sheets

(51) Int. Cl.
*H01L 51/50* (2006.01)
*H01L 27/32* (2006.01)

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/52* (2013.01); *H01L 51/5206* (2013.01); *H01L 51/5221* (2013.01); *H01L 27/3209* (2013.01); *H01L 51/001* (2013.01); *H01L 51/0055* (2013.01); *H01L 51/0058* (2013.01); *H01L 51/0068* (2013.01); *H01L 51/5262* (2013.01); *H01L 2251/301* (2013.01); *H01L 2251/558* (2013.01)

(58) Field of Classification Search
CPC ............ H01L 51/5056; H01L 51/5072; H01L 51/5088; H01L 51/5092; H01L 51/52; H01L 51/5206; H01L 51/5221; H01L 51/001; H01L 2251/301; H01L 2251/558
USPC ........................................................ 257/40
See application file for complete search history.

(56) References Cited

U.S. PATENT DOCUMENTS

| | | | | |
|---|---|---|---|---|
| 2006/0250084 | A1* | 11/2006 | Cok | ..................... H01L 51/5234 313/512 |
| 2007/0049155 | A1* | 3/2007 | Moro | ..................... H01L 51/448 445/24 |
| 2009/0258235 | A1* | 10/2009 | Tateishi | ..................... C08J 7/045 428/413 |
| 2012/0146492 | A1 | 6/2012 | Ryu | |
| 2013/0146850 | A1* | 6/2013 | Pieh | ..................... H01L 51/5203 257/40 |
| 2015/0344697 | A1* | 12/2015 | Nam | ..................... H01L 23/293 257/790 |

FOREIGN PATENT DOCUMENTS

| | | |
|---|---|---|
| CN | 201616434 | 10/2010 |
| CN | 103022051 | 4/2013 |
| CN | 104637890 | 5/2015 |
| CN | 104884528 | 9/2015 |
| CN | 105591035 | 5/2016 |

OTHER PUBLICATIONS

Chinese Office Action and Search Report for Chinese Patent Application No. 201610797608.0 dated Jun. 23, 2017.
Chinese Office Action and Search Report for Chinese Patent Application No. 201610797608.0, dated Aug. 29, 2017.

* cited by examiner

THIN-FILM PACKAGE STRUCTURE AND OLED COMPONENT

CROSS REFERENCE TO RELATED APPLICATION

The present application claims priority of Chinese patent application CN201610797608.0, entitled "Thin-Film Package Structure and OLED Component" and filed on Aug. 31, 2016, the entirety of which is incorporated herein by reference.

FIELD OF THE INVENTION

The present disclosure relates to the technical field of flat display device, and particularly to a thin-film package structure and an OLED component.

BACKGROUND OF THE INVENTION

In the technical field of display device, flat display devices such as Liquid Crystal Display (LCD) and Organic Light-Emitting Diode (OLED) display device have gradually replaced Cathode-Ray Tube (CRT) display device. The OLED display device has many advantages, such as self light-emitting, with a low driving voltage, a high light-emitting efficiency, a short response time, a high definition and a high picture contrast, nearly 180° viewing-angle, a wide operating temperature range, and so on. Moreover, in the OLED display device, flexible display and full color display with large area can be realized. Therefore, the OLED display device is widely used in mobile phone screen, computer screen, and full color TV, and is considered as one kind of display device with the greatest development potential in the industry.

Kodak Co. of American first raised a sandwich type organic electroluminescent component in U.S. Pat. No. 4,769,292 in 1987, which drew wide attention in the world. Kodak Co. first introduced a hole transmission layer in U.S. Pat. No. 4,885,211 two years later, which is a key point in OLED component design. Hence, a research boom on OLED began. Since OLED has the advantages of self light-emitting, in solid state, and with a wide viewing-angle and a high response speed, it has a broad application prospect in flat display device. OLED is even considered as a new generation of flat display product after LCD and Plasma Display Panel (PDP). In order to prevent quenching of the OLED component resulted from slanting of a light-emitting center to anode or cathode thereof, a carrier injection layer and a carrier transmission layer are further introduced based on the simple sandwich type component, and a multi-layered OLED component which is commonly seen now is gradually formed. As shown in FIG. 1, the OLED component comprises a substrate 1, an Indium Tin Oxide (ITO) transparent anode 2 that is arrange on the substrate 1, a hole injection layer 3 that is arrange on the ITO transparent anode 2, a hole transmission layer 4 that is arrange on the hole injection layer 3, a light-emitting layer 5 that is arrange on the hole transmission layer 4, an electron transmission layer 6 that is arrange on the light-emitting layer 5, an electron injection layer 7 that is arrange on the electron transmission layer 6, and a cathode 8 that is arrange on the electron injection layer 7. In order to improve a light-emitting efficiency of the component, the light-emitting layer is generally arranged as a host-guest doping system.

An OLED comprises an anode, an organic light-emitting layer, and a cathode that are formed on a substrate in sequence. The biggest defect of OLED is that OLED has a short lifetime, which is the biggest problem restricting the development of OLED industry. The reason for the short lifetime of OLED is that the organic material which constitutes the anode, the cathode, and the light-emitting layer of OLED component is highly sensitive to pollutants, aqueous vapor, and oxygen in the air. Electrochemical corrosion on OLED would easily occur in an aqueous vapor and oxygen containing environment, and thus the OLED component would be damaged. Therefore, OLED should be packaged in an effective manner so as to prevent aqueous vapor and oxygen from entering thereinto.

There are many methods for OLED packaging, such as desiccant packaging, ultraviolet (UV) adhesive packaging, UV adhesive and fill adhesive packaging, and frit adhesive packaging. The UV adhesive packaging technology is the earliest and the most commonly used OLED packaging technology and has the following advantages. According to the UV adhesive packaging technology, no solvent or a small amount of solvent is used, and thus the pollution of solvent on the environment can be reduced; a power consumption thereof is low, and solidification can be performed at a low temperature, which is applicable for a material sensitive to UV; a solidification speed thereof is high and can be used in a high speed production line; and a solidifying equipment thereof occupies a relatively small area. However, during UV adhesive packaging procedure, a sealant used therein is an organic material, and the molecular pinholes formed after solidification are relatively large. When OLED is packaged by a traditional method, aqueous vapor and oxygen would easily penetrate into the sealed space through the pinholes due to the solidification defect of the sealant, such as porosity thereof, and a weak binding strength thereof with the substrate and the packaging cover. As a result, the performance of the OLED component would deteriorate rapidly, and the lifetime thereof would be shortened.

Therefore, the OLED component should be packaged in an effective manner, so that a good sealability in the OLED component can be ensured, and a contact of the OLED component and aqueous vapor as well as oxygen in external environment can be reduced as much as possible, which is very important for the stability of the performance of the OLED component and prolonging the lifetime thereof. In order to achieve a better package effect, the package structure and package method in the prior art should be further improved, so that aqueous vapor and oxygen can be prevented from entering into the OLED component.

Thin-film package technology is especially applicable for some OLED with a special structure for which traditional cover package method cannot be used, such as the package of flexible OLED and flexible organic solar energy battery. In the thin-film package industry, the main method for improving the thin-film package effect in the industry is to use a dryer or to improve the aqueous vapor and oxygen proofing ability of the thin-film package layer as much as possible. For example, after the display component is manufactured, a multi-layered organic-inorganic composite thin-film can be deposited thereon so as to prolong a diffusion route of aqueous vapor and oxygen in the thin-film. However, there is an inherent limitation for this technology. This is because that, even if multiple layers of thin-films are deposited in an alternate manner, it cannot be guaranteed that no pinhole exists therein. Aqueous vapor and oxygen generally enter into the OLED component through pinholes, and consequently, the OLED component would be damaged or lose its effect. In this industry, the thin-film can be deposited through a low-temperature Atomic Layer Deposition (ALD) method, whereby a thin-film with a rather small amount of pinholes can be obtained. However, in the thin-film formed by this method, oxygen can be prevented, but aqueous vapor cannot be completely prevented. The thin-film package can be used for protecting diode or component which is sensitive to external environment, such as aqueous vapor or oxygen. The following diode or component can be protected by thin-film package, i.e., organic electronic component, solar energy battery, or secondary battery, such as secondary lithium battery. Among these diode or component, the organic electronic component can be easily affected by external environment, such as aqueous vapor or oxygen.

Since the lifetime of blue phosphorescence OLED cannot meet the using requirement at present, a fluorescent material with Triplet-Triplet Annihilation (TTA) effect is used to serve as the light-emitting material of blue OLED. According to TTA effect, two triplet excitons can be annihilated into one singlet exciton, whereby the light-emitting efficiency of the component can be improved. Theoretically, a quantum efficiency of an OLED comprising a light-emitting material with TTA effect can reach 40% to 62.5%.

It is shown by related research that, a generation probability of singlet exciton through TTA effect in the component can be increased be a suitable magnetic field, while a light-emitting intensity of the phosphorescence material would not be weakened. It is seemingly feasible that the magnetic material is directly used in the OLED. However, since the conductivity of magnetic material is poor, the above method is not feasible in fact.

SUMMARY OF THE INVENTION

In order to solve the aforesaid technical problem in the prior art, the present disclosure provides a thin-film package structure and an OLED component.

According to a first aspect, the present disclosure provides a thin-film package structure, which comprises:
 at least two organic material film layers; and
 at least two inorganic material film layers,
 wherein an organic material film layer and an inorganic material film layer are arranged in an alternate manner; and
 wherein the inorganic material film layer comprises a magnetic material film layer and a non-magnetic material film layer.

There are 2 to 5 organic material film layers.

There are 2 to 5 inorganic material film layers.

Preferably, the inorganic material film layer comprises one magnetic material film layer.

A material of the magnetic material film layer is one or more selected from a group consisting of Ni, Co, Fe, Mn, Bi, FeO—Fe2O3, NiO—Fe2O3, MnBi, MnO—Fe2O3, and NdFeB.

The magnetic material film layer is manufactured through magnetron sputtering or electron beam evaporation technology.

A thickness of the magnetic material film layer ranges from 200 nm to 2000 nm.

A material of the non-magnetic material film layer is one or more selected from a group consisting of alumina, zinc oxide, titanium oxide, silicon oxide, silicon nitride, and zirconia.

A material of the organic material film layer is one or more selected from a group consisting of PP-HMDSO/SiCN, polyvinyl alcohol, polyurethane acrylate polymer, and polyimide resin.

The organic material film layer is manufactured through coating, inkjet printing or Plasma Enhanced Chemical Vapor Deposition (PECVD) technology.

A thickness of the organic material film layer ranges from 500 nm to 5000 nm.

A surface tension of the thin-film package structure increases gradually from an inner layer to an outer layer thereof.

According to a second aspect, the present disclosure provides an Organic Light-Emitting Diode (OLED) component, which comprises:
 a substrate; and
 an OLED component that is formed on the substrate.

The substrate is a glass substrate, a ceramic substrate, or a flexible substrate.

Preferably, the substrate is a glass substrate, and the glass substrate comprises a Thin Film Transistor (TFT) array and a color filter.

The OLED component comprises an anode, a hole injection layer, a hole transmission layer, a light-emitting layer, an electron transmission layer, an electron injection layer, a cathode, and a charge generation layer.

Preferably, the anode is a transparent Indium Tin Oxide (ITO) conductive film.

Preferably, the transparent ITO conductive film is deposited thereon through sputtering technology.

Preferably, there are 1 to 3 light-emitting layers and at least one light-emitting layer has a Triplet-Triplet Annihilation (TTA) effect.

Preferably, there are 2 light-emitting layers, which are a yellow light-emitting layer and a blue light-emitting layer respectively. The blue light-emitting layer has a TTA effect.

Preferably, the blue light-emitting layer is doped by MADN with a mass ratio of 95% and TBPe with a mass ratio of 5%, wherein a molecular structural formula of MADN is as follows:

and
wherein a molecular structural formula of TBPe is as follows:

There are 2 hole transmission layers, which are a first hole transmission layer and a second hole transmission layer respectively.

There are 2 electron transmission layers, which are a first electron transmission layer and a second electron transmission layer respectively.

The OLED component comprises:
a glass substrate;
a transparent Indium Tin Oxide (ITO) conductive film that is formed on the glass substrate;
a hole injection layer that is formed on the transparent ITO conductive film;
a first hole transmission layer that is formed on the hole injection layer;
a blue light-emitting layer that is formed on the first hole transmission layer;
a first electron transmission layer that is formed on the blue light-emitting layer;
a charge generation layer that is formed on the first electron transmission layer;
a second hole transmission layer that is formed on the charge generation layer;
a yellow light-emitting layer that is formed on the second hole transmission layer;
a second electron transmission layer that is formed on the yellow light-emitting layer;
an electron injection layer that is formed on the second electron transmission layer; and
a cathode that is formed on the electron injection layer.

The hole injection layer is manufactured through vacuum vapor plating method.

The hole injection layer is CuPc, TNATA, or PEDOT.

The first hole injection layer is manufactured through vacuum vapor plating method.

A material of the first hole transmission layer is one selected from a group consisting of pairwise coupling diamine compound, triphenylamine compound, triarylamine polymer, and carbazole compound.

The blue light-emitting layer is manufactured through vacuum vapor plating method.

The first electron transmission layer is manufactured through vacuum vapor plating method.

A material of the first electron transmission layer is one selected from a group consisting of oxazole derivative, metal chelate quinoline derivative, quinoxaline derivative, diazo-anthracene derivative, diazo-phenanthrene derivative, and silicon-containing heterocyclic compound.

The charge generation layer is manufactured through vacuum vapor plating method.

The second hole transmission layer is manufactured through vacuum vapor plating method.

A material of the second hole transmission layer is one selected from a group consisting of pairwise coupling diamine compound, triphenylamine compound, triarylamine polymer, and carbazole compound.

The yellow light-emitting layer is manufactured through vacuum vapor plating method.

The second electron transmission layer is manufactured through vacuum vapor plating method.

A material of the second electron transmission layer is one selected from a group consisting of oxazole derivative, metal chelate quinoline derivative, quinoxaline derivative, diazo-anthracene derivative, diazo-phenanthrene derivative, and silicon-containing heterocyclic compound.

The electron injection layer is manufactured through vacuum vapor plating method.

The electron injection layer can be made of one material selected from a group consisting of lithium oxide, lithium boron oxide, silicon kali, cesium carbonate, and alkali metal fluoride.

The cathode is manufactured through vacuum vapor plating method.

The cathode can be made of one material selected from a group consisting of lithium, magnesium, aluminium, magnesium-silver alloy, and lithium-aluminium alloy.

A vapor plating speed of the vacuum vapor plating should be controlled in a range from 1 Å/s to 10 Å/s.

Compared with the prior art, the present disclosure can bring about the following advantages or beneficial effects. In the thin-film package structure according to the present disclosure, the thin-film layers have a gradually changing tension gradient, whereby aqueous vapor in the thin-film layers can be extruded thereout. Moreover, the aqueous vapor outside the thin-film layers can be prevented from entering thereinto. In this manner, the influence of pinholes in the thin-film layers can be reduced, a package effect can be improved, and the packaged component can be protected. The OLED component can be packaged by the thin-film package structure disclosed herein, and the following two beneficial effects can be brought about. On the one hand, a magnetic field generated by the magnetic material in the thin-film layers can act on the OLED, and thus a light-emitting efficiency of the OLED display device can be improved. On the other hand, aqueous vapor and oxygen at outside environment can be prevented from permeating into the OLED display device by the thin-film package structure, and a package performance of the OLED display device can be satisfied. In addition, the thin-film package structure and technology disclosed herein can also be used in the packaging of flexible OLED display device.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings.

Figure 1:
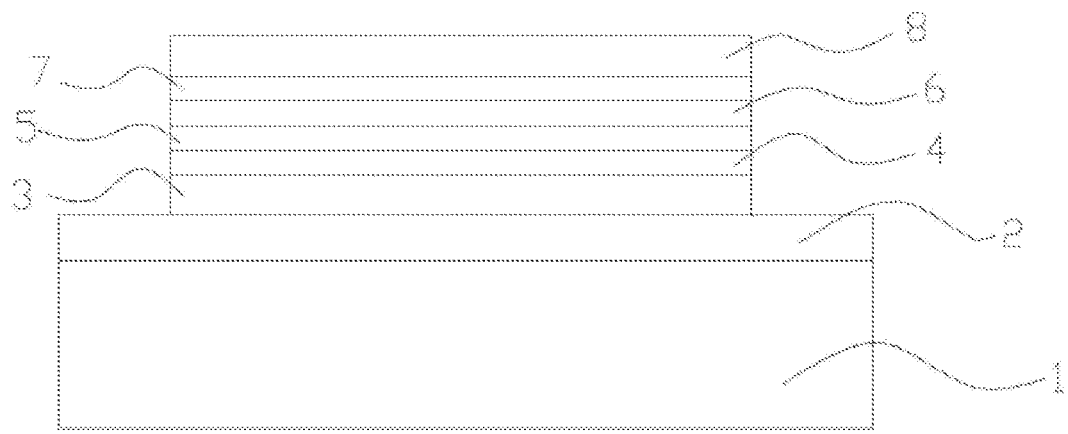
FIG. 1 schematically shows a structure of an OLED component in the prior art.

In the drawings, the same components are represented by the same reference signs, and the size of each component does not represent the actual size of the corresponding component.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Embodiment 1

Figure 2:
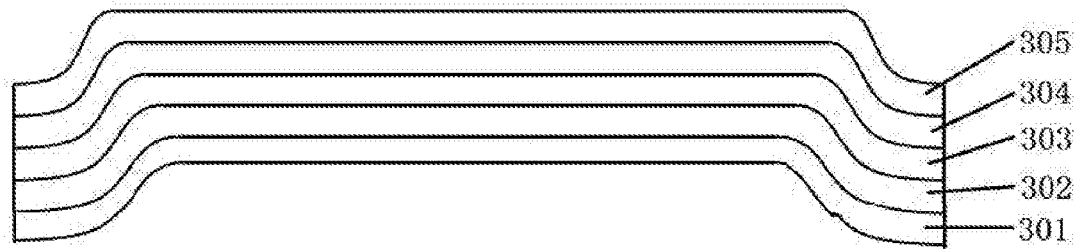
FIG. 2 schematically shows a thin-film package structure according to embodiment 1 of the present disclosure.
Figure 3:
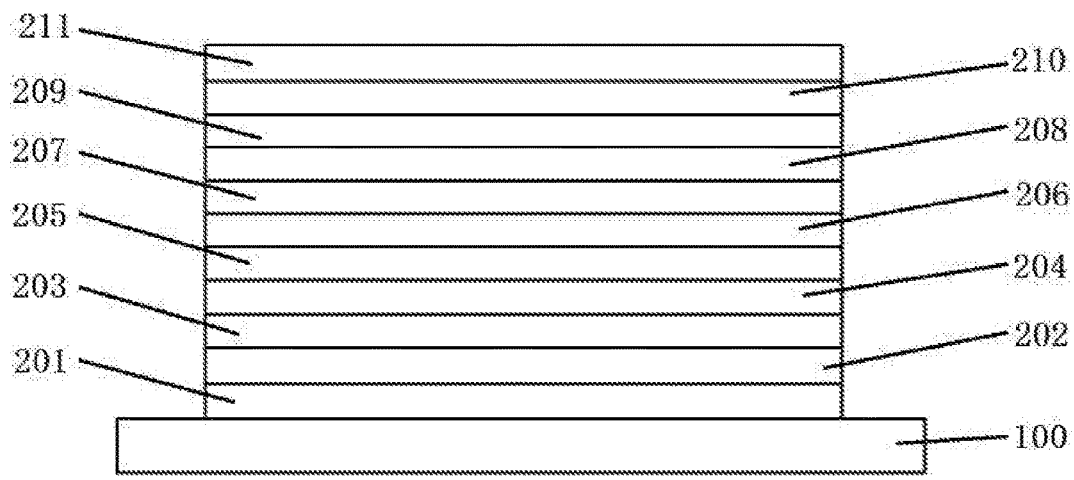
FIG. 3 schematically shows a structure of an OLED component according to embodiment 2 of the present disclosure.
Figure 4:
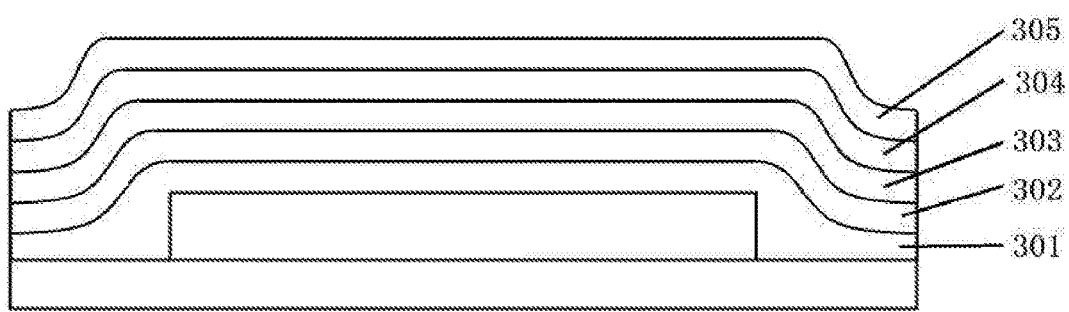
FIG. 4 schematically shows a structure of a packaged OLED component according to embodiment 3 of the present disclosure.

FIG. 2 schematically shows a thin-film package structure according to embodiment 1 of the present disclosure. As shown in FIG. 2, the thin-film package structure according to the present embodiment comprises:

a first inorganic material film layer 301;

a first organic material film layer 302, which is formed on the first inorganic material film layer 301;

a magnetic material film layer 303, which is formed on the first organic material film layer 302;

a second organic material film layer 304, which is formed on the magnetic material film layer 303; and a second inorganic material film layer 305, which is formed on the second organic material film layer 304.

A material of the first inorganic material film layer 301 is silicon nitride with a thickness in a range from 200 nm to 2000 nm.

A material of the first organic material film layer 302 is PP-HMDSO/SiCN with a thickness in a range from 500 nm to 5000 nm.

A material of the magnetic material film layer 303 is NdFeB with a thickness in a range from 200 nm to 2000 nm.

A material of the second organic material film layer 304 is PP-HMDSO/SiCN with a thickness in a range from 500 nm to 5000 nm.

A material of the second inorganic material film layer 305 is silicon nitride with a thickness in a range from 200 nm to 2000 nm.

A surface tension of the thin-film package structure increases gradually from the first inorganic material film layer 301 to the second inorganic material film layer 305.

In the thin-film package structure according to the present embodiment, the thin-film layers have a gradually changing tension gradient, whereby aqueous vapor in the thin-film layers can be extruded thereout. Moreover, the aqueous vapor outside the thin-film layers can be prevented from entering thereinto. In this manner, the influence of pinholes in the thin-film layers can be reduced, a package effect can be improved, and the packaged component can be protected. The aqueous vapor moves from a thin-film layer with a low surface tension to a thin-film layer with a high surface tension. Therefore, when the aqueous vapor exists in the thin-film package layer, it will move from the thin-film layer with a low surface tension to the thin-film layer with a high surface tension. That is, the aqueous vapor can be extruded out of the thin-film package layer. Moreover, the aqueous vapor outside the thin-film layers can be prevented from entering thereinto. In this manner, the influence of pinholes in the thin-film layers can be reduced, a package effect can be improved, and the component that is packaged by the thin-film package layer can be protected.

Embodiment 2

The present embodiment further provides an Organic Light-Emitting Diode (OLED) component, which comprises:

a substrate; and an OLED component that is formed on the substrate.

The substrate is a glass substrate 100, which comprises a Thin Film Transistor (TFT) array and a color filter.

The OLED component comprises:

a glass substrate 100;

a transparent Indium Tin Oxide (ITO) conductive film 201 that is formed on the glass substrate 100;

a hole injection layer 202 that is formed on the transparent ITO conductive film 201;

a first hole transmission layer 203 that is formed on the hole injection layer 202;

a blue light-emitting layer 204 that is formed on the first hole transmission layer 203;

a first electron transmission layer 205 that is formed on the blue light-emitting layer 204;

a charge generation layer 206 that is formed on the first electron transmission layer 205;

a second hole transmission layer 207 that is formed on the charge generation layer 206;

a yellow light-emitting layer 208 that is formed on the second hole transmission layer 207;

a second electron transmission layer 209 that is formed on the yellow light-emitting layer 208;

an electron injection layer 210 that is formed on the second electron transmission layer 209; and a cathode 211 that is formed on the electron injection layer 210.

The anode is made of ITO with a good conductivity, a good chemical stability and physical form stability, a high work function, and a high transparency in visible light. Moreover, the anode can be performed by certain surface treatments to improve its work function, such as $O_2$ plasma treatment or UV-ozone treatment.

The hole injection layer 202 is manufactured through vacuum vapor plating method.

The hole injection layer 202 should have a good energy level matching degree with the anode and the adjacent hole transmission layer. The hole injection layer has a P-type doped structure, and a hole transmission material can be doped with oxidizer such as SbCl5, FeCl3, iodine, F4-TCNQ, or TBAHA. The hole injection layer can also be arranged to have a quantum well structure or other structures by which the hole injection therein can be improved.

The first hole transmission layer 203 is manufactured through vacuum vapor plating method.

A material of the first hole transmission layer 203 is PTDATA, which has a good thermal stability and thus a thin-film without pinhole can be formed through vacuum vapor plating method.

The blue light-emitting layer 204 is manufactured through vacuum vapor plating method.

The first electron transmission layer 205 is manufactured through vacuum vapor plating method.

A material of the first electron transmission layer 205 is oxazole derivative, which has a high electron mobility ratio, a high glass transition temperature, and a good thermal stability. Hence, a uniform thin-film without pinhole can be formed through thermal vapor plating method.

The charge generation layer 206 is manufactured through vacuum vapor plating method.

The second hole transmission layer 207 is manufactured through vacuum vapor plating method.

A material of the second hole transmission layer 207 is PTDATA. A hole mobility ratio of the second hole transmission layer 207 is higher than or equal to that of the first hole transmission layer 203. A thickness of the first hole transmission layer 203 is larger than that of the second hole transmission layer 207.

The first hole transmission layer 203 contains a lot of carriers, and the carriers can be prevented from accumulating at an interface thereof. The second hole transmission layer 207 transmits the carriers rapidly and perform energy level matching. Excitons in an emission layer is restricted in a light-emitting region. In this manner, a light-emitting efficiency of the OLED component can be improved, and a lifetime thereof can be further prolonged.

The yellow light-emitting layer 208 is manufactured through vacuum vapor plating method.

The second electron transmission layer 209 is manufactured through vacuum vapor plating method.

A material of the second electron transmission layer 209 is oxazole derivative, which has a high electron mobility ratio, a high glass transition temperature, and a good thermal stability. Hence, a uniform thin-film without pinhole can be formed through thermal vapor plating method.

The electron injection layer 210 is manufactured through vacuum vapor plating method.

A material of the electron injection layer 210 is silicon kali.

The cathode 211 is manufactured through vacuum vapor plating method.

A material of the cathode 211 is a metal or metal alloy with a low work function. The material of the cathode 211 is lithium.

The transparent ITO conductive film 201 is deposited through sputtering technology.

The blue light-emitting layer 204 has a TTA effect. The blue light-emitting layer 204 is doped by MADN with a mass ratio of 95% and TBPe with a mass ratio of 5%, wherein a molecular structural formula of MADN is as follows:

and wherein a molecular structural formula of TBPe is as follows:

According to the present embodiment, the glass substrate 100 is cleaned, and a cleanliness thereof should conform that particles (particle size ≥1 μm) ≤300 ea. A thickness of the glass substrate 100 ranges from 0.3 mm to 0.7 mm. Harmful substances in the glass substrate 100 can be removed through the clean procedure.

Embodiment 3

The present embodiment provides a method for packaging the OLED component according to embodiment 2 by the thin-film package structure according to embodiment 1.

A first inorganic material film layer 301 is manufactured on the OLED component through PECVD technology.

The first organic material film layer 302 is manufactured on the first inorganic material film layer 301 through PECVD technology.

The magnetic material film layer 303 is manufactured on the first organic material film layer 302 through magnetron sputtering technology.

The second organic material film layer 304 is manufactured on the magnetic material film layer 303 through PECVD technology.

The second inorganic material film layer 305 is manufactured on the second organic material film layer 304 through PECVD technology.

A material of the first inorganic material film layer 301 is silicon nitride with a thickness in a range from 200 nm to 2000 nm.

A material of the first organic material film layer 302 is PP-HMDSO/SiCN with a thickness in a range from 500 nm to 5000 nm.

A material of the magnetic material film layer 303 is NdFeB with a thickness in a range from 200 nm to 2000 nm.

A material of the second organic material film layer 304 is PP-HMDSO/SiCN with a thickness in a range from 500 nm to 5000 nm.

A material of the second inorganic material film layer 305 is silicon nitride with a thickness in a range from 200 nm to 2000 nm.

A surface tension of the thin-film package structure increases gradually from the first inorganic material film layer 301 to the second inorganic material film layer 305.

An intensity of a magnetic field generated by the magnetic material film layer 303 is in a range from 5 mT to 500 mT at a position of the OLED.

The OLED component can be packaged through the following steps.

The OLED component can be packaged by the thin-film package structure disclosed herein, and the following two beneficial effects can be brought about. On the one hand, a magnetic field generated by the magnetic material in the thin-film layers can act on the OLED, and thus a light-emitting efficiency of the OLED display device can be improved. On the other hand, aqueous vapor and oxygen at outside environment can be prevented from permeating into the OLED display device by the thin-film package structure, and a package performance of the OLED display device can be satisfied. In addition, the thin-film package structure and technology disclosed herein can also be used in the packaging of flexible OLED display device.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. An Organic Light-Emitting Diode (OLED) component, which is packaged by a thin-film package structure, wherein the OLED component comprises:
   a substrate; and
   an OLED component that is formed on the substrate;
   wherein the thin-film package structure, comprising:
   at least two organic material film layers; and
   at least two inorganic material film layers,
   wherein an organic material film layer and an inorganic material film layer are arranged in an alternate manner;

wherein the inorganic material film layer comprises a magnetic material film layer and a non-magnetic material film layer;

wherein the at least two organic material film layers and the at least two inorganic material film layers are stacked such that a gradually changing tension gradient is established among the film layers and a surface tension of the thin-film package increases from one side of the stacked film layers to an opposite side of the stacked film layers; and wherein a material of the magnetic material film layer is one or more selected from a group consisting of Ni, Co, Fe, Mn, Bi, FeO—Fe2O3, NiO—Fe2O3, MnBi, MnO—Fe2O3, and NdFeB.

2. The OLED component according to claim 1, wherein the substrate is a glass substrate, a ceramic substrate, or a flexible substrate.

3. The OLED component according to claim 1, wherein the OLED component comprises:
a glass substrate;
a transparent Indium Tin Oxide (ITO) conductive film that is formed on the glass substrate;
a hole injection layer that is formed on the transparent ITO conductive film;
a first hole transmission layer that is formed on the hole injection layer;
a blue light-emitting layer that is formed on the first hole transmission layer;
a first electron transmission layer that is formed on the blue light-emitting layer;
a charge generation layer that is formed on the first electron transmission layer;
a second hole transmission layer that is formed on the charge generation layer;
a yellow light-emitting layer that is formed on the second hole transmission layer;
a second electron transmission layer that is formed on the yellow light-emitting layer;
an electron injection layer that is formed on the second electron transmission layer; and
a cathode that is formed on the electron injection layer.

4. The OLED component according to claim 3, wherein a material of the first hole transmission layer is one selected from a group consisting of pairwise coupling diamine compound, triphenylamine compound, triarylamine polymer, and carbazole compound.

5. The OLED component according to claim 3, wherein a material of the first electron transmission layer is one selected from a group consisting of oxazole derivative, metal chelate quinoline derivative, quinoxaline derivative, diazo-anthracene derivative, diazo-phenanthrene derivative, and silicon-containing heterocyclic compound.

6. The OLED component according to claim 1, wherein a thickness of the magnetic material film layer ranges from 200 nm to 2000 nm.

7. The OLED component according to claim 1, wherein a material of the organic material film layer is one or more selected from a group consisting of PP-HMDSO/SiCN, polyvinyl alcohol, polyurethane acrylate polymer, and polyimide resin.

8. The OLED component according to claim 7, wherein a thickness of the organic material film layer ranges from 500 nm to 5000 nm.

* * * * *